(12) United States Patent
Yokota et al.

(10) Patent No.: US 7,064,352 B2
(45) Date of Patent: Jun. 20, 2006

(54) DIAMOND SEMICONDUCTOR DEVICE AND METHOD FOR MANUFACTURING THE SAME

(75) Inventors: Yoshihiro Yokota, Kobe (JP); Nobuyuki Kawakami, Kobe (JP); Takeshi Tachibana, Kobe (JP); Kazushi Hayashi, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 0 days.

(21) Appl. No.: 11/003,510

(22) Filed: Dec. 6, 2004

(65) Prior Publication Data

US 2005/0127373 A1      Jun. 16, 2005

(30) Foreign Application Priority Data

Dec. 12, 2003  (JP) ............................. 2003-415041

(51) Int. Cl.
*H01L 31/312*   (2006.01)
*H01L 21/00*    (2006.01)

(52) U.S. Cl. ........................................ 257/77; 438/105
(58) Field of Classification Search ................ 438/105, 438/931, 780, 783; 257/77, 608, 628, 648, 257/652, 657
See application file for complete search history.

(56) References Cited

U.S. PATENT DOCUMENTS 5,173,761 A  * 12/1992 Dreifus et al. ................. 257/22
5,344,526 A    9/1994 Nishibayashi et al.
6,833,059 B1 * 12/2004 Kawarada ............... 204/403.01
6,940,090 B1 *  9/2005 Saito et al. ..................... 257/20

FOREIGN PATENT DOCUMENTS

| JP | 1-158774    | 12/1987 |
| JP | 3273985     | 2/1993  |
| JP | 2000-114523 | 10/1998 |
| JP | 2002-57167  | 8/2000  |
| JP | 2002-75960  | 8/2000  |
| JP | 2002-76369  | 9/2000  |

* cited by examiner

*Primary Examiner*—David Nelms
*Assistant Examiner*—Calvin Lee
(74) *Attorney, Agent, or Firm*—Reed Smith LLP; Stanley P. Fisher, Esq.; Juan Carlos A. Marquez, Esq.

(57) ABSTRACT

A diamond semiconductor device includes a substrate made of single crystal diamond; a first diamond layer, placed on the substrate, containing an impurity; a second diamond layer containing the impurity, the second diamond layer being placed on the substrate and spaced from the first diamond layer; and a third diamond layer which has a impurity content less than that of the first and second diamond layers, which acts as a channel region, and through which charges are transferred from the first diamond layer to the second diamond layer. The first and second diamond layers have a first and a second end portion, respectively, facing each other with a space located therebetween. The first and second end portions have slopes epitaxially formed depending on the orientation of the substrate. The third diamond layer lies over the slopes and a section of the substrate that is located under the space.

10 Claims, 7 Drawing Sheets

DIAMOND SEMICONDUCTOR DEVICE AND METHOD FOR MANUFACTURING THE SAME

BACKGROUND OF THE INVENTION

1. Field of the Invention

The present invention relates to a diamond semiconductor device suitable for field effect transistors, light-emitting diodes, and various sensors and also relates to a method for manufacturing such a device.

2. Description of the Related Art

Diamond has superior properties such as high heat conductivity, wide bandgap, high saturated electron velocity, and high saturated hole velocity. Therefore, diamond is expected to be suitable for high-power devices, high-frequency devices, and semiconductor devices working under severe conditions such as high-temperature conditions or radiation exposure conditions because those devices must have such superior properties.

Examples of a known field effect transistor (FET) including a diamond thin-film include a metal insulator semiconductor field effect transistor (MISFET) including a gate electrode, a channel layer acting as a functional layer, and an insulating layer placed therebetween (see, for example, Japanese Unexamined Patent Application Publication No. 1-158774). A MISFET disclosed in Japanese Unexamined Patent Application Publication No. 1-158774 includes an insulating single crystal diamond substrate, a semiconducting diamond layer disposed on the substrate, and an insulating layer locally placed on the semiconductive diamond layer. The MISFET further includes a source metal electrode, a drain metal electrode, and a gate metal electrode placed on the insulating layer, the source and drain metal electrodes being arranged on the semiconducting diamond layer, the insulating layer being placed between the source and drain metal electrodes. On the other hand, Japanese Patent No. 3273985 discloses a FET having a structure in which a high-resistance diamond layer is placed between an insulating single crystal diamond substrate and a semiconducting diamond layer, the structure being hereinafter referred to as a pip structure.

Examples of methods for manufacturing such transistors include a procedure in which a diamond region is separated into a source and a drain region by an etching process; a diamond section for forming a channel region is exposed; and an insulating layer, a gate electrode, and the like are formed on the diamond section, as described in Japanese Unexamined Patent Application Publication No. 2000-114523. Japanese Unexamined Patent Application Publication No. 2002-57167 discloses a procedure in which a diamond region is separated into a source and a drain region by an etching process, an epitaxial growth process, a selective ion injection process, or another process and a channel region is then formed by epitaxially growing a diamond thin-film so as to cover gaps and areas therearound. Furthermore, Japanese Unexamined Patent Application Publication No. 2002-76369 discloses a procedure in which a diamond region is separated into a source and a drain region by an etching process and a channel region is then formed by epitaxially growing a diamond thin-film on an etched portion.

Examples of a process for etching a diamond piece includes a plasma etching process or another etching process in which a mask is formed on the diamond piece, which is then exposed to plasma formed from gas containing oxygen atoms (see, for example, U.S. Pat. No. 5,344,526 and Japanese Unexamined Patent Application Publication No. 2002-75960).

The known procedures and processes described above have the problems below. In the procedures disclosed in Japanese Unexamined Patent Application Publication Nos. 2000-114523 and 2002-57167, since etching is performed perpendicularly to the diamond surface, the source regions and drain regions formed by etching have end faces substantially perpendicular to the surfaces of devices. There is a problem in that dielectric breakdown occurs at the insulating layers and the channel regions because electric fields between the source and drain regions insulated from the gate regions with the insulating layers are concentrated on corners of these regions when the end faces of the source and drain regions are perpendicular to the device surfaces.

Furthermore, there is a problem in that discontinuities in the insulating layers cause short circuits and discontinuities in the gate electrodes cause a deterioration in performance. For a transistor described in Japanese Unexamined Patent Application Publication No. 2000-114523, when an insulating layer is formed on a gap area by a vapor deposition process or a sputtering process, the insulating layer is grown on a face facing a deposition source or a sputtering target and hardly grown on faces parallel to the deposition source or the sputtering target, that is, end faces of the source region and the drain region; hence, portions of the insulating layer on the end faces thereof have a small thickness. If a substrate for forming the substrate is placed in such a manner that the substrate is slightly inclined, some of the end faces of the source and drain regions are hidden from the deposition source or the sputtering target; hence, the insulating layer is hardly grown on the end faces thereof. In particular, boundary areas between the bottom of an etched area and the end faces of the source and drain regions are hidden from the deposition source or the sputtering target because the end faces are perpendicular to the bottom; hence, the insulating layer is hardly grown on the boundary areas. Such failure in forming the insulating layer causes insulation failure and short circuits, thereby causing a decrease in device reliability and a reduction in yield.

The above problems are supposed to be solved by inclining the end faces of the source and drain regions; however, it is substantially impossible to process the end faces by any existing process with high reproducibility such that the end faces have a controlled shape. At the present moment, a slope with a length of 1 μm or less can hardly be formed on a diamond piece with high hardness by any mechanical polishing process. If possible in future, such a process is not suitable for manufacturing semiconductor devices because mechanical polishing may cause serious internal defects.

When grooves or holes are formed by an etching process, the walls of the grooves or the holes are substantially perpendicular to the bottoms of the grooves or the holes as described above or the boundaries between the walls and bottoms of the grooves or the boundaries between the walls and bottoms of the holes have a semicircular shape, that is, a round shape in cross section in general. In the latter case, there is no problem caused by forming an insulating layer on the bottom of a recession formed by the etching process; however, the thickness of the insulating layer is not uniform because the walls are perpendicular to the bottoms. Since the walls make a sharp angle that is substantially equal to a right angle with the surface of the insulating layer, electric fields are concentrated on the boundaries between the walls and the surface thereof, whereby dielectric breakdown or the like is caused.

In some methods for manufacturing silicon semiconductor devices, an anisotropic etching process in which the etching rate varies depending on the crystal plane is used. In this process, for example, the rate of etching a {111} surface is allowed to be smaller than the rate of etching a {100} surface by the use of a suitable etchant under wet conditions. Therefore, if a mask including a silicon dioxide layer is formed on an area of a {100} surface that must be prevented from being etched and uncovered areas thereof are then exposed to an etchant, slopes having a {111} surface are formed at end portions of the uncovered areas, whereby recessed portions having an inverse trapezoidal shape in cross section parallel to the thickness direction can be formed.

Since diamond has extremely higher chemical resistance as compared with silicon, there is no etchant for etching diamond. Therefore, a plasma etching process is under study. It is supposed that perpendicular etching or anisotropic etching that depends on the crystal orientation can be performed by selecting appropriate conditions using plasma containing oxygen. However, inclined side faces can hardly be formed if perpendicular etching is performed.

For anisotropic etching that depends on the crystal orientation, flat etched faces can hardly be formed because etched faces have irregularities and/or steps due to etch pits that are formed when a material to be etched has internal defects such as dislocations. In the case that the rate of etching the {111} surface is smaller than the rate of etching the {100} surface as described above, if the {100} surface has only a small {111} surface portion, this portion is etched into a pyramid because the rate of etching the portion is low. Furthermore, if the {100} surface is slightly inclined when an etching operation is started, a flat etched face can hardly formed because the {111} surface appears in an early stage of the operation. This phenomenon also occurs when the plasma etching process is used.

When a portion having a desired shape is formed by the plasma etching process, defects due to the impact of ions and the adsorption of impurities are unavoidably formed in inner portions and surfaces of etched areas exposed to plasma. Such defects cause a reduction in charge mobility and an increase in charge mobility and are therefore undesirable.

It is substantially impossible to enhance the performance of semiconductor components such as transistors by forming slopes at end portions of source and drain regions by an etching process because of the problems described above.

SUMMARY OF THE INVENTION

The present invention has been made to solve the above problems. It is an object of the present invention to provide a diamond semiconductor device and methods for manufacturing such a diamond semiconductor device. The diamond semiconductor device includes a channel region and a gate insulating layer on which electric fields are prevented from being concentrated. The gate insulating layer has a uniform thickness and high dielectric strength. There are substantially no defects at the interface between the channel region and the gate insulating layer.

A diamond semiconductor device according to the present invention includes a substrate substantially made of single crystal diamond; a first diamond layer, locally placed on the substrate, containing an impurity; a second diamond layer containing the impurity, the second diamond layer being locally placed on the substrate and spaced from the first diamond layer; and a third diamond layer which has a impurity content less than that of the first and second diamond layers, which acts as a channel region located between the first and second diamond layers, and through which charges are transferred from the first diamond layer to the second diamond layer. The first diamond layer has a first end portion and the second diamond layer has a second end portion facing the first end portion with a space located therebetween. The first and second end portions each have corresponding slopes epitaxially formed depending on the orientation of the substrate. The third diamond layer lies over the slopes of the first and second end portions and a section of the substrate that is located under the space.

The term "a substrate substantially made of single crystal diamond" herein means a substrate made of complete single crystal diamond or a substrate which includes a plurality of bound diamond crystals having orientations slightly different from each other and which has substantially the same properties as those of a single crystal substrate.

In the present invention, the first and second end portions have the slopes epitaxially formed and end faces, perpendicular to the substrate surface, having a small height; hence, the third diamond layer and/or an insulating layer placed on the first and second diamond layers has a uniform thickness. Therefore, electric fields can be prevented from being concentrated on a channel region located between the first and second diamond layers and the insulating layer lying on the channel region, thereby enhancing the dielectric strength of those portions. This results in an increase in the performance of the diamond semiconductor device functioning as a transistor, a memory device, or the like.

The slopes of the first and second diamond layers are preferably inclined at an angle of 32 to 58 degrees to the substrate surface. Such a configuration is effective in preventing defects and distortions from being formed in the third diamond layer to enhance the charge-transfer rate, whereby high-performance semiconductor devices that can cope with high speed and high frequency can be achieved. Furthermore, the configuration is effective in preventing the series resistance of the first or second diamond layer from being increased.

The first and second diamond layers may have faces parallel to the substrate surface and the faces and slopes of the first and second diamond layers may have curved or flat face portions, located therebetween, having an inclination angle less than that of the slopes. Such a configuration is effective in preventing defects from being formed in the third diamond layer, effective in preventing the impurity from being segregated therein, effective in preventing defects from being formed in the insulating layer placed on the third diamond layer, and effective in preventing the dielectric strength of the insulating layer from being deteriorated due to the concentration of an electric field.

At least one of the slopes of the first and second diamond layers may have a {111} surface, a {100} surface, an intermediate surface between the substrate surface and {111}, or an intermediate surface between the substrate surface and {100}. The term "intermediate surface" herein means a surface of which the orientation is between the orientations of two surfaces, the orientations being different from each other.

It is preferable that the substrate have a {110} surface, the boundaries between the substrate surface and the first and second diamond layers extend in the <110> direction, and the slopes of the first and second diamond layers each have a {111} surface. It is preferable that the substrate have a {110} surface, the boundaries between the substrate surface and the first and second diamond layers extend in the <100> direction, and the slopes of the first and second diamond layers each have a {100} surface. It is preferable that the substrate have a {100} surface, the boundaries between the substrate surface and the first and second diamond layers extend in the <110> direction, the slopes of the first and second diamond layers each have a {111} surface.

Since the facing direction of one of the slopes is coincident with the direction of a component vector of the line normal to the slope having a {111} or {100} surface, the vector being parallel to the substrate surface, the first and second end portions have edges that are extremely straight. This allows the edges of the first and second end portions to be highly parallel. Therefore, when a voltage is applied between the first and second diamond layers, a uniform electric field is generated; hence, stable operation can be achieved. When the orientation of the substrate and the direction in which the boundaries between the substrate surface and the first and second diamond layers extend are not as described above, the first and second end portions have faces that make an angle of greater than 58 degrees in many cases and the edges of the first and second end portions can hardly kept straight; hence, the number of stacking faults is high and the dielectric strength is low. When a voltage is applied between the first and second diamond layers, a nonuniform electric field is generated; hence, the performance of the diamond semiconductor device functioning as a transistor or the like is low.

The slopes of the first and second diamond layers preferably have an average roughness of 1 nm or less and the third diamond layer preferably has a section, located on the substrate, having an average roughness of 5 nm or less. Such a configuration is effective in rendering the speed of charges moving in the channel region constant. The term "average roughness" means the arithmetic average roughness Ra specified in JIS B0601-2001.

In the diamond semiconductor device, the first and second diamond layers may be arranged on an undoped single crystal diamond layer.

A method for manufacturing a diamond semiconductor device according to the present invention includes a step of locally forming a first diamond layer and a second diamond layer both containing an impurity on a substrate by an epitaxial growth process, those layers acting as a source or drain region, and a step of forming a third diamond layer, having an impurity content less than that of the first and second diamond layers, acting as a channel region located between the first and second diamond layers. The first diamond layer has a first end portion and the second diamond layer has a second end portion facing the first end portion. The first and second end portions have slopes epitaxially formed.

In order to solve the above problems, the inventors have performed intensive research and then developed a technique for forming a portion between a source and a drain region, that is, a channel region by not an etching process but an epitaxial growth process. If a diamond thin-film is formed on, for example, a diamond {100} substrate by homoepitaxy under adjusted conditions, an end portion of the thin-film has a {111} surface, that is, a slope, in some cases. Processes for growing thin-films having end faces with desired surfaces have been known. However, it has not been studied to enhance the performance of semiconductor devices such as transistors by making use of slopes formed by such growing processes.

In the present invention, the first and second diamond layers are formed by an epitaxial growth process, whereby the slopes of the first and second diamond layers are epitaxially formed. This allows the formation of a highly flat channel region having no etch pits.

In the manufacturing method, the step of locally forming the first and second diamond layers makes use of a mask having a thickness greater than or equal to one half of the thickness of the thickest portions of the first and second diamond layers. If a thin mask having a thickness less than one half of that of the first and second diamond layers is used to form the first and second diamond layers, those layers are grown and extend over the top of the thin mask to form canopies. The insulating layer can hardly formed under such canopies, which are not therefore preferable. If the mask used herein has a thickness equal to about one half of that of the first and second diamond layers, those layers are not formed on the top of the mask. This is because when the first and second diamond layers are formed so as to have the slopes, end faces of the first and second diamond layers have a height equal to about one half of the thickness of portions, other than the slopes, of the first and second diamond layers.

The manufacturing method may further include a step of etching the first and second diamond layers in the direction perpendicular to the substrate surface, the etching step being prior to the step of forming the third layer. Since the slopes are formed by the epitaxial growth process, the first and second end portions in contact with side faces of the mask have steep faces. Therefore, after the first and second diamond layers are formed by the epitaxial growth process using the mask, these layers are etched back in the direction perpendicular to the substrate surface using the mask such that their thickness is reduced by the amount equal to the height of the steep faces, whereby the steep faces are eliminated from the channel region. If the steep faces cannot be completely eliminated but can be partially eliminated, defects and distortions due to the steep faces can be prevented from being formed in the third diamond layer.

In the manufacturing method, the first and second end portions have faces perpendicular to the substrate surface and the third diamond layer lies over the slopes of the first and second diamond layers and preferably has a thickness greater than the height of the perpendicular faces. This allows the third diamond layer to have no faces perpendicular to the substrate surface.

According to the present invention, a first and a second diamond layer acting as a source or drain region having a first and a second end portion, respectively, facing each other are formed by an epitaxial growth process so as to have slopes each located at the first and second end portions. Such a configuration is effective in preventing defects from being formed at the interface between a channel region and a gate insulating layer, effective in allowing the insulating layer to have a uniform thickness, and effective in preventing electric fields from being concentrated on the channel region and the gate insulating layer. Therefore, dielectric breakdown can be prevented.

DESCRIPTION OF THE PREFERRED EMBODIMENTS

Diamond semiconductor devices according to embodiments of the present invention will now be described in detail with reference to the accompanying drawings. First, a diamond semiconductor device according to a first embodiment of the present invention is described below. FIG. 2C is a sectional view showing a configuration of the diamond semiconductor device of this embodiment. The diamond semiconductor device includes a single crystal diamond substrate 1 having a {110} surface, a first heavily boron-doped diamond layer 3a acting as a source region, and a second heavily boron-doped diamond layer 3b acting as a drain region, those layers being locally placed on a first face of the diamond substrate 1. The following boundaries have a length of 50 to 200 μm: boundaries between the first face of the diamond substrate 1 and the first heavily boron-doped diamond layer 3 and boundaries between the first face thereof and the second heavily boron-doped diamond layer 3b. The first heavily boron-doped diamond layer 3a has a first end portion and the second heavily boron-doped diamond layer 3b has a second end portion facing the first end portion. The first and second end portions extend perpendicular to the plane of FIG. 2C and have a length of 50 to 200 μm. The direction in which the first and second end portions extend perpendicularly to the plane of FIG. 2C is herein referred to as the longitudinal direction of the first and second end portions. For the first and second heavily boron-doped diamond layers 3a and 3b, the longitudinal direction of the first and second end portions corresponds to the <110> direction or <100> direction of the surface of the diamond substrate 1.

An undoped diamond layer 5 lies over the first and second end portions and a space therebetween. A source electrode 7 is placed on a section of the first heavily boron-doped diamond layer 3a, the section being not covered with the undoped diamond layer 5. A drain electrode 8 is placed on a section of the second heavily boron-doped diamond layer 3b, the section being not covered with the undoped diamond layer 5. An end area of the source electrode 7 faces an end area of the drain electrode 8 and an insulating layer 9 lies over the facing end areas of the source and drain electrodes 7 and 8 and the undoped diamond layer 5. A gate electrode 10 is placed on the insulating layer 9 placed on the undoped diamond layer 5. That is, the insulating layer 9 is placed between the gate electrode 10 and the undoped diamond layer 5. At least one part of a section of the undoped diamond layer 5 functions as a channel region, the section being located between the first and second heavily boron-doped diamond layers 3a and 3b. The diamond semiconductor device includes the first and second heavily boron-doped diamond layers 3a and 3b acting as semiconductor diamond layers and the undoped diamond layer 5, placed therebetween, acting as a high-resistance diamond layer as described above and is therefore referred to as a pip FET.

In the diamond semiconductor device, the first end portion of the first heavily boron-doped diamond layer 3a that is close to the second heavily boron-doped diamond layer 3b has an inclined sub-portion of which the thickness is gradually reduced toward outside and the second end portion of the second heavily boron-doped diamond layer 3b that is close to the first heavily boron-doped diamond layer 3a also has an inclined sub-portion of which the thickness is gradually reduced toward outside. That is, the first and second end portions each have corresponding slopes. The first and second heavily boron-doped diamond layers 3a and 3b therefore have a reduced number of faces perpendicular to the first face of the diamond substrate 1; hence, the undoped diamond layer 5 and the insulating layer 9 placed on the first and second heavily boron-doped diamond layers 3a and 3b have a uniform thickness. The channel region and the insulating layer 9 placed thereon also have a reduced number of faces perpendicular to the first face of the diamond substrate 1. This prevents electric fields from being concentrated on the channel region and the insulating layer 9, thereby allowing the channel region and the insulating layer 9 to have high dielectric strength to enhance transistor performance.

Figure 1A:
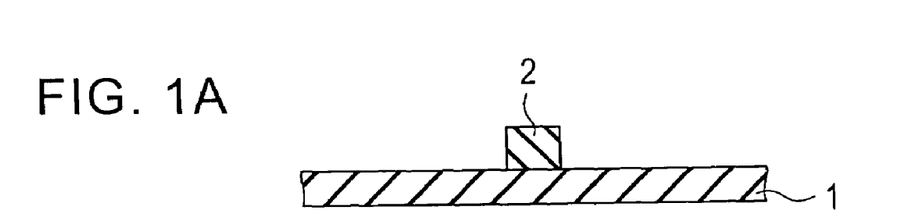
FIGS. 1A to 1D are sectional views showing steps of manufacturing a diamond semiconductor device according to a first embodiment of the present invention in the order of the steps.

A method for manufacturing the diamond semiconductor device of the first embodiment will now be described. FIGS. 1A to 1D and 2A to 2C are sectional views showing steps of manufacturing the diamond semiconductor device in the order of the steps. With reference to FIG. 1A, a first mask 2 is formed on an area of the first face of the single crystal diamond substrate 1 having a {110} surface, the area being prevented from being covered with a diamond layer. The first mask 2 includes, for example, an alumina layer and has a thickness of, for example, 180 nm.

Figures 1B, 1C:
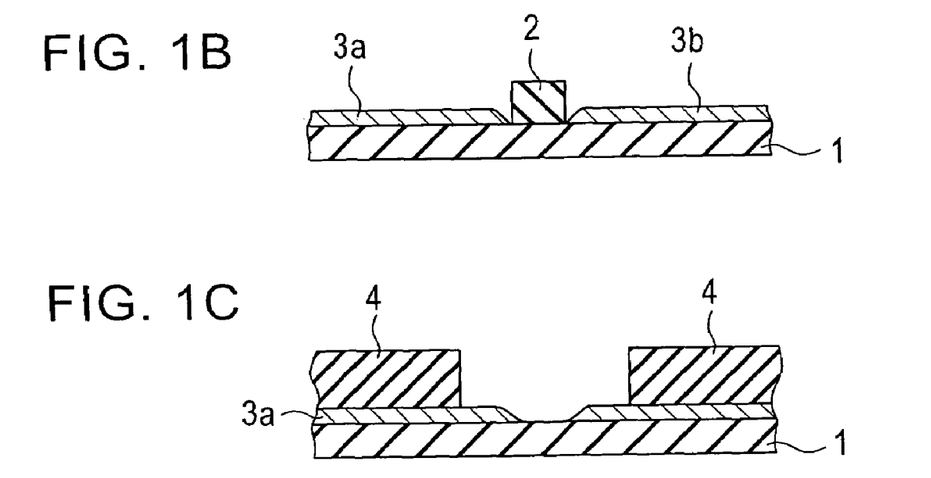

Diamond layers, heavily doped with boron, having a thickness of, for example, 45 nm are formed on the first face of the diamond substrate 1 by a microwave plasma process using a microwave having a frequency of 2.45 GHz. In this operation, a system, developed by National Institute for Research in Inorganic Materials, including a quartz reactor is used; a reaction gas containing hydrogen, 0.3% to 0.5% of methane, and 0.01% to 0.05% of diborane on a volume basis is used; the reaction pressure is 6.67 kPa (50 Torr); and the substrate temperature is 750° C. to 800° C. This allows diamond heavily doped with boron to be grown only on areas of the first face of the diamond substrate 1 (an epitaxial growth process), the areas being exposed from the first mask 2, whereby the first and second heavily boron-doped diamond layers 3a and 3b are formed around the first mask 2 as shown in FIG. 1B. The first and second end portions of the first and second heavily boron-doped diamond layers 3a and 3b, respectively, each have corresponding faces that are in contact with the first mask 2. The contact faces have a height of about 10 nm and perpendicularly extend from the first face of the diamond substrate 1. The first and second end portions have a thickness of more than 10 nm and each have corresponding slopes. One of the slopes is inclined at an angle of 35 degrees to the first face of the diamond substrate 1 and has a {111} surface, when the longitudinal direction of the first and second end portions is parallel to the <110> direction. The other one is inclined at an angle of 45 degrees to the first face thereof and has a {100} surface, when the longitudinal direction of the first and second end portions is parallel to the <100> direction.

With reference to FIG. 1C, after the first mask 2 is completely removed by an etching process using phosphoric acid and hydrofluoric acid, second masks 4 including alumina layers are each formed on the corresponding first and second heavily boron-doped diamond layers 3a and 3b in such a manner that the first and second end portions are exposed from the second masks 4. The undoped diamond layer 5 having a thickness of, for example, 30 nm is formed over the first and second end portions by a microwave plasma process using a microwave having a frequency of 2.45 GHz. In this operation, a system, developed by National Institute for Research in Inorganic Materials, including a quartz reactor is used; a reaction gas containing hydrogen, 0.5% to 1.0% of methane, and 0.25% to 1.00% of oxygen on a volume basis is used; the reaction pressure is 6.67 kPa (50 Torr); and the substrate temperature is 750° C. to 800° C. The second masks 4 are then removed in the same manner as that for removing the first mask 2.

Figure 1D:
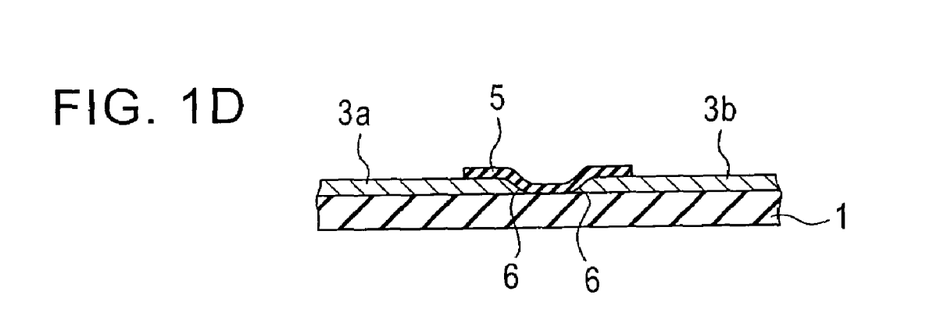

With reference to FIG. 1D, this procedure allows the undoped diamond layer 5 to be formed over an exposed portion 1a of the diamond substrate 1 and the first and second end portions. If conditions for forming the undoped diamond layer 5 are appropriate, the undoped diamond layer 5 has slopes having the same crystal planes as those of the slopes of the first and second heavily boron-doped diamond layers 3a and 3b. One of the slopes of the undoped diamond layer 5 lies on the slope of the first end portion and has substantially a uniform thickness and the other one lies on the slope of the second end portion and has substantially a uniform thickness. This configuration is effective in preventing defects and distortions from being formed in the undoped diamond layer 5. This results in enhancing the charge-transfer rate; hence, the diamond semiconductor device offers high performance and can cope with high speed and high frequency. The surface of the undoped diamond layer 5 is extremely flat on the lattice parameter level. For example, the slopes of the undoped diamond layer 5 that lie on the slopes of the first and second heavily boron-doped diamond layers 3a and 3b have an average roughness Ra of 1 nm or less and a portion of the undoped diamond layer 5 that is located ed on the exposed portion 1a has an average roughness Ra of 3 nm or less.

Figure 2A:
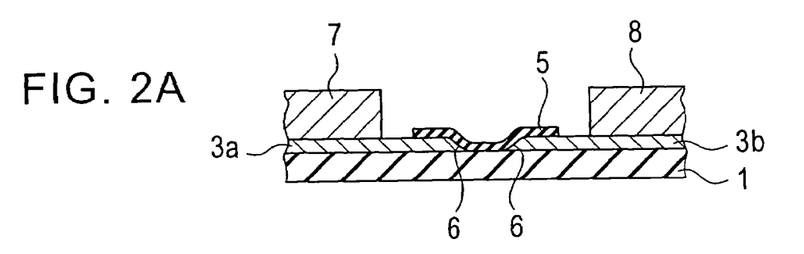
FIG. 2A to 2C are sectional views showing steps of manufacturing the diamond semiconductor device in the order of the steps, the steps shown in FIGS. 2A to 2C being subsequent to the steps shown in FIGS. 1A to 1D.
Figure 2B:
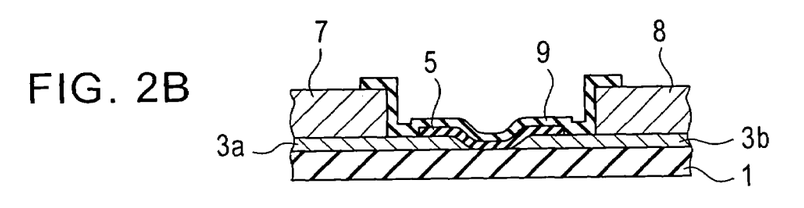
Figure 2C:
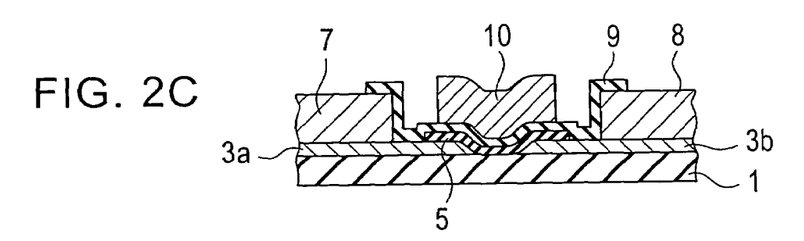

With reference to FIG. 2A, the source electrode 7 is formed on the first heavily boron-doped diamond layer 3a and the drain electrode 8 is formed on the second heavily boron-doped diamond layer 3b using a resist mask (not shown) such that the source and drain electrodes 7 and 8 are not in contact with the undoped diamond layer 5. With reference to FIG. 2B, the insulating layer 9 formed over an end face and end area of the drain electrode 8 that is close to the source electrode 7, the space between the source and drain electrodes 7 and 8, and an end face and end area of the source electrode 7 that is close to the drain electrode 8 using a resist mask (not shown). The insulating layer 9 has a thickness of, for example, 37 nm and contains, for example, alumina. With reference to FIG. 2C, the gate electrode 10 is then formed on the insulating layer 9 placed on the undoped diamond layer 5 using a resist mask (not shown). The gate electrode 10 contains gold.

When the first and second heavily boron-doped diamond layers 3a and 3b acting as a source region and a drain region, respectively, are formed by the epitaxial growth process, it is an effective way to form a mask on a space between areas for forming the first and second heavily boron-doped diamond layers 3a and 3b to grow diamond films. In this way, the diamond films are not grown on the mask but grown in such a manner that end faces of the diamond films are in contact with side faces of the mask; hence, the inclination angle of the mask side faces affects the inclination angle of the end faces of the diamond films. Therefore, when the mask side faces are perpendicular to the first face of the diamond substrate 1, the end faces of the diamond films that are in contact with the mask side faces can be perpendicular to the first face thereof in some cases. Defects 6 due to impurities and distortions are likely to be formed in the perpendicular end faces. The defects 6 do not reach the surface of the undoped diamond layer 5 and are terminated in the undoped diamond layer 5.

In the method for manufacturing the diamond semiconductor device according to this embodiment, since the first and second heavily boron-doped diamond layers 3a and 3b are formed by the epitaxial growth process, the slopes of the first and second end portions can be readily formed so as to have predetermined crystal orientations and the channel region that has no etch pits and is extremely flat can be readily formed. This enhances the insulation between the channel region and the gate electrode 10 separated from the undoped diamond layer 5 with the insulating layer 9, reduces the interface state, and prevents defects from being formed; hence, the diamond semiconductor device functioning as a field effect transistor has a satisfactory transconductance, superior frequency properties, and high dielectric strength and can cope with high power. This technique can be applied to crystalline materials of which the crystal planes can be readily selected in addition to the diamond semiconductor device.

In the diamond semiconductor device of this embodiment, the slopes of the first and second heavily boron-doped diamond layers 3a and 3b make an angle of 35 or 45 degrees with the first face of the diamond substrate 1. The present invention is not limited to such a configuration and the slopes of the first and second heavily boron-doped diamond layers 3a and 3b may make an angle of 32 to 58 degrees with the first face thereof. The slopes of the first and second heavily boron-doped diamond layers 3a and 3b need not necessarily have the same angle exactly. The slopes, inclined at such angles, having a {111} or {100} surface can be obtained by the epitaxial growth process. In order to allow the insulating layer 9 to have a uniform thickness and in order to prevent an electric field from being concentrated on the insulating layer 9, the inclination angles of the slopes is preferably small. In order to allow the first and second heavily boron-doped diamond layers 3a and 3b to have the same thickness, a decrease in inclination angle increases the area of the slopes, of which the thickness is gradually reduced. This causes an increase in the series resistances of the first and second heavily boron-doped diamond layers 3a and 3b. Therefore, the inclination angles of the slopes are preferably 32 to 58 degrees with respect to the first face of the diamond substrate 1.

In the diamond semiconductor device, the slopes have a {111} or {100} surface. The present invention is not limited to such a configuration. The slopes may have, for example, an intermediate surface between {111} and {100}. Furthermore, the diamond substrate 1 preferably has a {111} or {100} surface. This allows the inclination angles of the slopes to be readily adjusted. In order to reduce the density of defect levels of the slopes, the slopes preferably have low-index surfaces. However, even if the slopes have high-index surfaces that are intermediates between low-index surfaces, electric fields can be prevented from being concentrated on the slopes and the dielectric strength can be kept high.

When the diamond substrate 1 has a {110} surface, faces of the first and second heavily boron-doped diamond layers 3a and 3b that are parallel to the first face of the diamond substrate 1 has a {110} surface and the slopes of the first and second heavily boron-doped diamond layers 3a and 3b have a {111} or a {100} surface. On the other hand, when the first face thereof has a {100} surface, the faces of the first and second heavily boron-doped diamond layers 3a and 3b that are parallel to the first face of the diamond substrate 1 have a {100} surface and the slopes of the first and second heavily boron-doped diamond layers 3a and 3b have a {111} surface. Thus, the slopes having predetermined inclination angles can be readily formed by the epitaxial growth process. When the slopes have a {111} or a {100} surface, the slopes make an angle of 35 or 45 degrees with first face thereof.

When the faces of the first and second heavily boron-doped diamond layers 3a and 3b that are parallel to the first face of the diamond substrate 1 have a {111} surface, one of the slopes of the first and second heavily boron-doped diamond layers 3a and 3b has a {100} surface. A component vector of the line normal to the other one is inclined at an angle of ±60 degrees to the direction that is parallel to the substrate surface and perpendicular to the longitudinal direction of the first and second heavily boron-doped diamond layers 3a and 3b, the component vector being parallel to the substrate surface. If one of the first and second heavily boron-doped diamond layers 3a and 3b that has the slope having a {100} surface is used as a drain region and the other one having the slope having a {111} surface is used as a source region, the source region has an end face with a sawtooth shape. Since the electric field between the source and drain regions is concentrated on the tips of the saw teeth and the threshold voltage is reduced, such a configuration is preferable for uses in which the threshold voltage must be low. However, this configuration causes portions on which electric fields are concentrated to be formed in the undoped diamond layer 5 or the channel region and the insulating layer 9. This causes a deterioration in dielectric strength. Furthermore, the sawtooth shape of the source end face is naturally formed; hence, the size of the saw teeth cannot be controlled. This causes unstable operation; hence, the configuration is not preferable in general.

Curved faces or gentle slopes preferably each lie at corresponding boundary regions between the slopes of the first and second heavily boron-doped diamond layers 3a and 3b and the faces of the first and second heavily boron-doped diamond layers 3a and 3b that are parallel to the first face of the diamond substrate 1, the gentle slopes having inclination angles less than those of the slopes. This reduces the change in the angle between the slopes and the curved faces or gentle slopes in contact with the slopes, whereby the concentration of an electric field can be effectively prevented and defects and distortions due to dislocation can be prevented from being formed in the undoped diamond layer 5.

In the diamond semiconductor device of this embodiment, the slopes of the undoped diamond layer 5 have an average roughness Ra of 1 nm or less and the bottom area of the undoped diamond layer 5 has an average roughness Ra of 3 nm or less. The present invention is not limited to such a configuration. The slopes of the first and second heavily boron-doped diamond layers 3a and 3b may have an average roughness Ra of 1 nm or less and the bottom area of the undoped diamond layer 5 may an average roughness Ra of 5 nm or less. This allows the rate of charges moving in the channel region to be constant.

If the channel region is formed an isotropic etching process or an anisotropic etching process that depends on the crystal orientation, uncontrollable etch pits are formed; hence, the channel region has a large roughness. In the diamond semiconductor device of this embodiment, the channel region is not formed such a process but formed by the epitaxial growth of diamond. Therefore, the portion of the undoped diamond layer 5 that acts as the channel region has an average roughness Ra of 5 nm or less; thereby achieving high flatness. From the flatness of each diamond layer placed around the channel region, it can be identified that which process the diamond layer has been formed by.

In the method for manufacturing the diamond semiconductor device of this embodiment, the first mask 2 has a thickness greater than that of the first and second heavily boron-doped diamond layers 3a and 3b and may have a thickness greater than or equal to one half of that of the first and second heavily boron-doped diamond layers 3a and 3b. If a mask having a thickness less than one half of that of the first and second heavily boron-doped diamond layers 3a and 3b is used to form the first and second heavily boron-doped diamond layers 3a and 3b by the epitaxial growth process, those layers are grown and extend over the top of the mask to form canopies. The insulating layer 9 can hardly formed under such canopies, which are not therefore preferable. The end faces of the slopes of the first and second heavily boron-doped diamond layers 3a and 3b have a thickness equal to about one half of the thickness of central areas of the first and second heavily boron-doped diamond layers 3a and 3b, the slopes being not included in the central areas. Therefore, when the first mask 2 has a thickness greater than or equal to one half of that of the first and second heavily boron-doped diamond layers 3a and 3b, those layers can be prevented from extending over the top the first mask 2. If the thickness of the first mask 2 is reduced during the formation of the first and second heavily boron-doped diamond layers 3a and 3b, the first mask 2 may have a thickness greater than the total of the reduced thickness and one half of the thickness of the first and second heavily boron-doped diamond layers 3a and 3b.

Figure 3A:
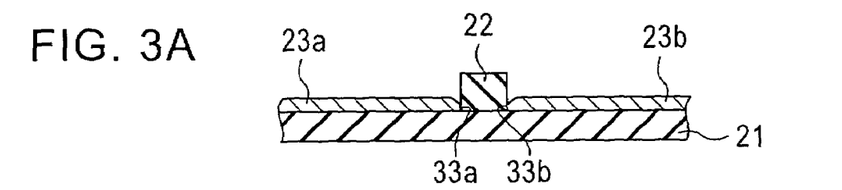
FIGS. 3A to 3F are sectional views showing steps of manufacturing a diamond semiconductor device according to a second embodiment of the present invention in the order of the steps.
Figure 3B:
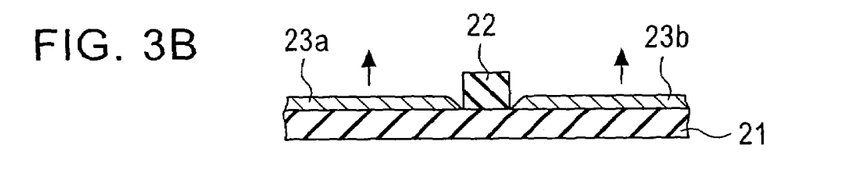
Figure 3C:
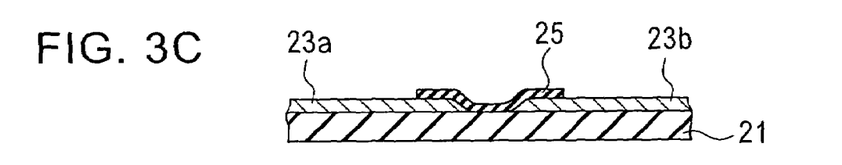
Figure 3D:
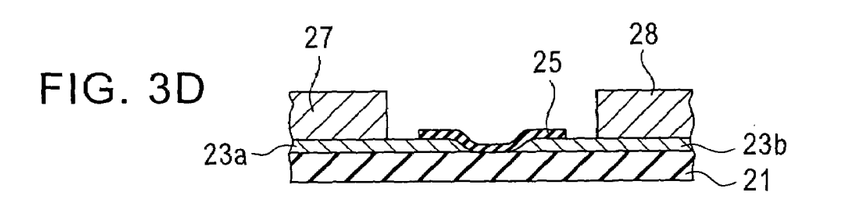
Figure 3E:
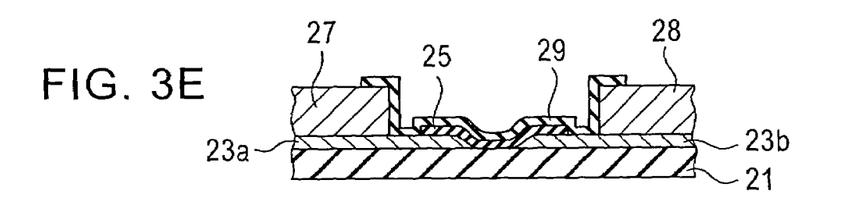
Figure 3F:
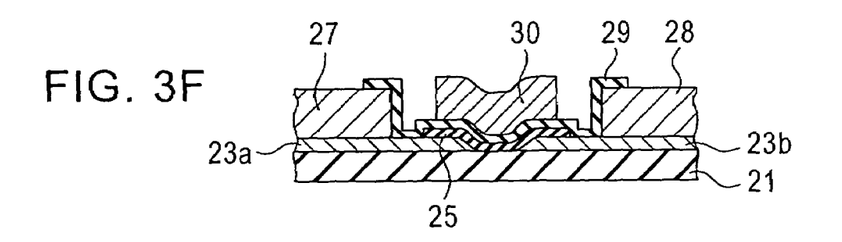

A diamond semiconductor device according to a second embodiment of the present invention will now be described. FIGS. 3A to 3F are sectional views showing steps of manufacturing the diamond semiconductor device of this embodiment in the order of the steps. The diamond semiconductor device is formed by substantially the same procedure and under substantially the same conditions as those described in the first embodiment. With reference to FIG. 3A, an alumina mask 22 is formed on a diamond substrate 21, and a first heavily boron-doped diamond layer 23a and a second heavily boron-doped diamond layer 23b are then formed on the diamond substrate 21. With reference to FIG. 3B, the first and second heavily boron-doped diamond layers 23a and 23b are etched by the procedure disclosed in Japanese Unexamined Patent Application Publication No. 2002-75960 described above in such a manner that the alumina mask 22 is allowed to remain thereon. That is, the first and second heavily boron-doped diamond layers 23a and 23b are etched back. This allows the first and second heavily boron-doped diamond layers 23a and 23b to be etched perpendicularly to the upper face of the diamond substrate 1. The etch back procedure reduces the thickness of the first and second heavily boron-doped diamond layers 23a and 23b by about 10 nm, which is equal to the height of faces of those layers that are perpendicular to the upper face of the diamond substrate 1. This allows the faces, perpendicular thereto, located on both sides of a channel region 11a to be eliminated without changing the angle and width of slopes of the first and second heavily boron-doped diamond layers 23a and 23b.

The alumina mask 22 is then completely removed by an etching process using phosphoric acid and hydrofluoric acid. With reference to FIGS. 3C to 3F, an undoped diamond layer 25, a source electrode 27, a drain electrode 28, an insulating layer 29, and a gate electrode 30 are formed by substantially the same procedure and under substantially the same conditions as those described in the first embodiment, whereby the diamond semiconductor device, which is referred to as a pip-FET, is obtained.

When some slopes are formed by an epitaxial growth process, end portions of diamond layers that are in contact with side faces of a mask usually have steep faces. In the method for manufacturing the diamond semiconductor device of this embodiment, after the first and second heavily boron-doped diamond layers 23a and 23b are formed by an epitaxial growth process using the alumina mask 22, those layers are perpendicularly etched back using the alumina mask 22 such that their thickness is reduced by the amount equal to the height of the perpendicular faces, whereby the perpendicular faces are eliminated. If the perpendicular faces cannot be completely eliminated but can be partially eliminated, defects and distortions due to the perpendicular faces can be prevented from being formed in the undoped diamond layer 25 formed in a subsequent step.

Figure 4:
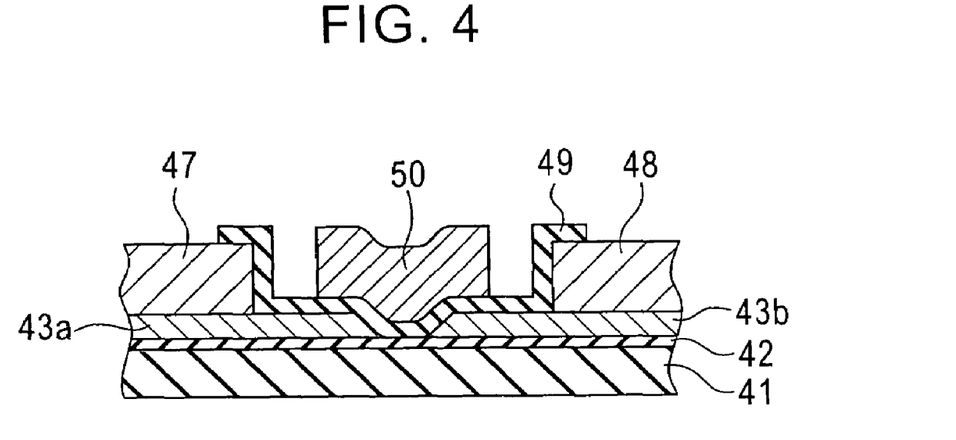
FIG. 4 is a sectional view showing a configuration of a diamond semiconductor device according to a third embodiment of the present invention.
Figure 5:
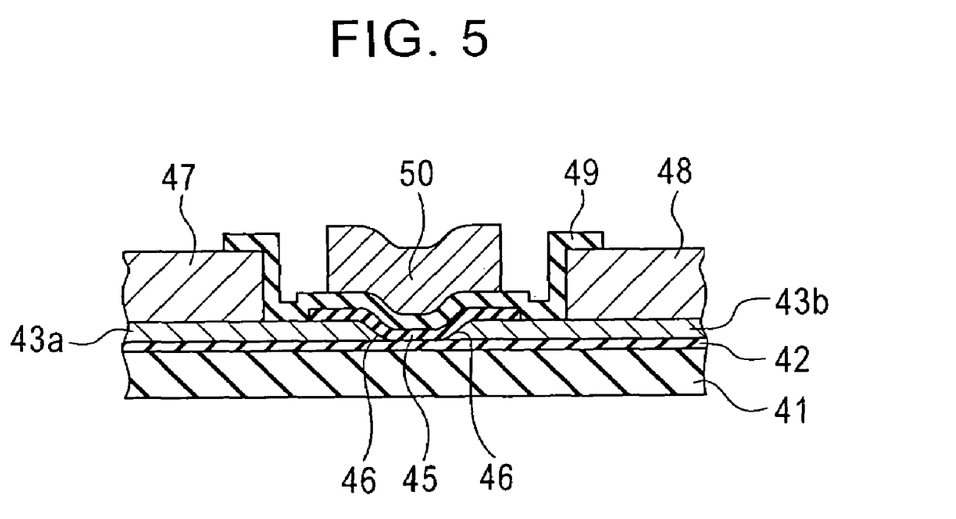
FIG. 5 is a sectional view showing a configuration of a diamond semiconductor device that is a modification of the diamond semiconductor device of the third embodiment.

A diamond semiconductor device according to a third embodiment of the present invention will now be described. FIG. 4 is a sectional view showing a configuration of the diamond semiconductor device of this embodiment. FIG. 5 is a sectional view showing a configuration of a modified diamond semiconductor device that is a modification of the diamond semiconductor device of this embodiment. In the diamond semiconductor device of the first or second embodiment, the first and second heavily boron-doped diamond layers are placed on the substrate and the undoped diamond layer acting as a third diamond layer is placed above those layers and substrate. The present invention is not limited to such a configuration. As shown in FIG. 4, the diamond semiconductor device of this embodiment may include, for example, a diamond substrate 41, an undoped diamond layer 42 placed thereon, a first heavily boron-doped diamond layer 43a acting as a source region, and a second heavily boron-doped diamond layer 43b acting as a drain region, the first and second heavily boron-doped diamond layers 43a and 43b being locally placed on the undoped diamond layer 42.

In the diamond semiconductor device of this embodiment, a source electrode 47 is placed on the first heavily boron-doped diamond layer 43a and a drain electrode 48 is placed on the second heavily boron-doped diamond layer 43b. The source electrode 47 has a first end portion and the drain electrode 48 has a second end portion facing the first end portion. An insulating layer 49 extends over the first and second end portions, the first and second heavily boron-doped diamond layers 43a and 43b, and the undoped diamond layer 42. A gate electrode 50 is placed on the insulating layer 49 disposed on the undoped diamond layer 42. The diamond semiconductor device of this embodiment includes the undoped diamond layer 42 acting as a high-resistance diamond layer and the first and second heavily boron-doped diamond layers 43a and 43b, locally placed on the undoped diamond layer 42, acting as semiconductor diamond layers as described above and is therefore referred to as a pip-FET. In the diamond semiconductor device of this embodiment, at least one part of a section of the undoped diamond layer 42 functions as a channel region, the section being located between the first and second heavily boron-doped diamond layers 43a and 43b, that is, the section being exposed from the first and second heavily boron-doped diamond layers 43a and 43b.

The modified diamond semiconductor device shown in FIG. 5 may include a diamond substrate 41, a first undoped diamond layer 42 placed thereon, a first heavily boron-doped diamond layer 43a having a first end portion, a second heavily boron-doped diamond layer 43b having a second end portion facing the first end portion, and a second undoped diamond layer 45 lying over the first and second end portions. The first and second heavily boron-doped diamond layers 43a and 43b act as a source region and a drain region, respectively, and are locally placed on the first undoped diamond layer 42. In the modified diamond semiconductor device, a source electrode 47 is placed on the first heavily boron-doped diamond layer 43a and a drain electrode 48 is placed on the second heavily boron-doped diamond layer 43b. The source electrode 47 has a third end portion and the drain electrode 48 has a fourth end portion facing the third end portion. An insulating layer 49 lies over the third and fourth end portions and the second undoped diamond layer 45. A gate electrode 50 is placed on the insulating layer 49 lying on the second undoped diamond layer 45. In the modified diamond semiconductor device, as well as the diamond semiconductor device of the first embodiment described above, defects 46 can be formed in a portion of the undoped diamond layer 5 that is located between the first and second heavily boron-doped diamond layers 43a and 43b in some cases. The defects 46 do not reach the surface of the second undoped diamond layer 45 but are terminated in the second undoped diamond layer 45.

The modified diamond semiconductor device includes, as described above, the first undoped diamond layer 42 acting as a high-resistance diamond layer; the first and second heavily boron-doped diamond layers 43a and 43b, locally placed on the undoped diamond layer 42, acting as semiconductor diamond layers; and the second undoped diamond layer 45 of which a section is placed between the first and second heavily boron-doped diamond layers 43a and 43b and which acts as a high-resistance diamond layer. This device is therefore referred to as a pip-FET. In the device having such a configuration, at least one part of the following section functions as a channel region: the section of the second undoped diamond layer 45 that is placed between the first and second heavily boron-doped diamond layers 43a and 43b or a section of the first undoped diamond layer 42 that is placed between the first and second heavily boron-doped diamond layers 43a and 43b.

In the diamond semiconductor device of the third embodiment and the modification thereof, as well as the diamond semiconductor devices of the first and second embodiments, the first and second heavily boron-doped diamond layers 43a and 43b are formed epitaxially on the undoped diamond layer 42 under adjusted conditions, whereby slopes are each formed at the first and second end portions of the first and second heavily boron-doped diamond layers 43a and 43b. This reduces the size of end faces of the first and second heavily boron-doped diamond layers 43a and 43b, the end faces being perpendicular to the diamond substrate 41. Therefore, electric fields are prevented from being concentrated on the channel region and the insulating layer 49 placed thereon, thereby allowing the region and layer to have high dielectric strength to enhance transistor performance.

The diamond semiconductor devices of the first to third embodiments each include the corresponding undoped diamond layers acting as third diamond layers as described above. The present invention is not limited to such configurations. For example, heavily boron-doped diamond layers acting as a source or drain region may be placed on a semiconductor substrate. In this configuration, an undoped diamond layer acting as a third diamond layer is not necessary because charges are transferred through the semiconductor substrate.

EXAMPLES

Examples of the present invention will now be described using field effect transistors including diamond thin-films. For comparison, comparative examples will also be described.

Example 1

Figure 6:
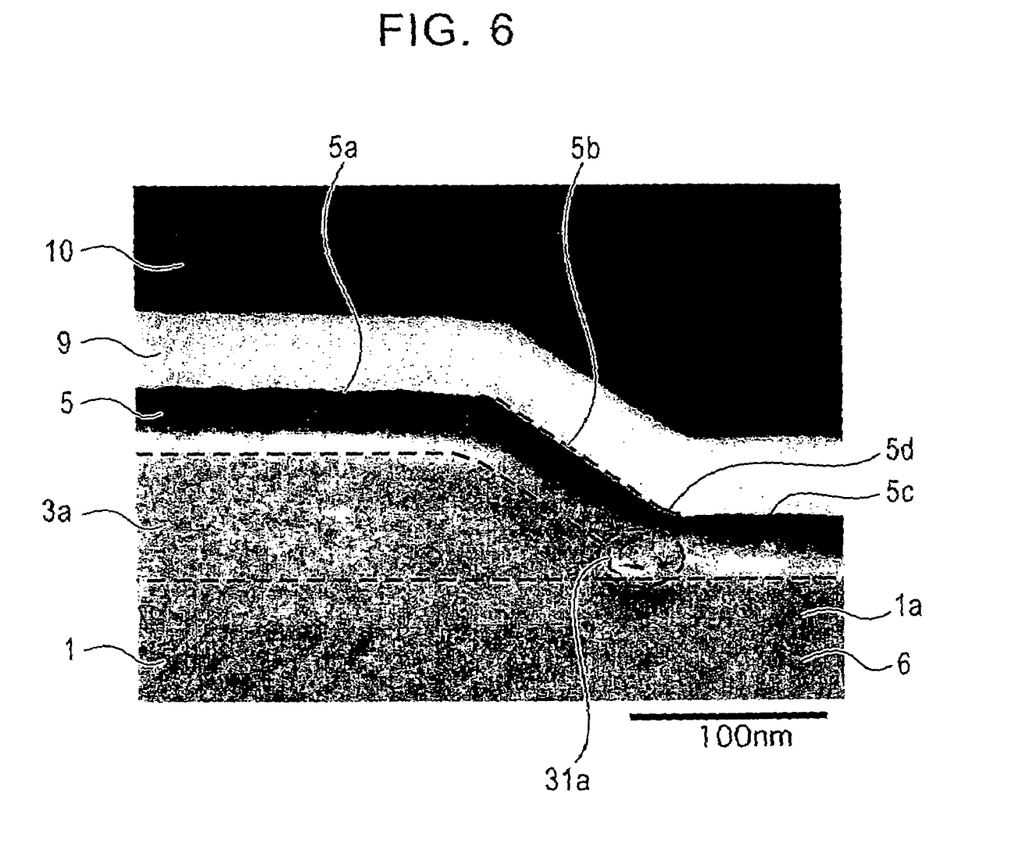
FIG. 6 is a transmission electron microscope (TEM) photograph partly showing a transistor of Example 1 in cross section at 300,000× magnification.

A pip-FET (hereinafter referred to as "transistor") of this example is described below. FIG. 6 is a TEM (transmission electron microscope) photograph partly showing the transistor in cross section. The transistor was prepared by substantially the same procedure and under substantially the same conditions as those described in the first embodiment. For the transistor shown in FIG. 6, a heavily boron-doped diamond layer 3a was formed on a diamond substrate 1 having a {110} surface and an undoped diamond layer 5 is then formed on the heavily boron-doped diamond layer 3a. An insulating layer 9 and a gate electrode 10 were formed on the undoped diamond layer 5 in that order. In the transistor, the longitudinal direction of end portions of the heavily boron-doped diamond layer 3a was parallel to the <110> direction. The undoped diamond layer 5 had a slope 5b having an inclination angle of about 35 degrees; a bottom surface 5c; and a gentle slope 5d, located therebetween, having an inclination angle of about 16 degrees. The heavily boron-doped diamond layer 3a had a perpendicular end face 31a in contact with the undoped diamond layer 5, which had defects 6 therein. The application of a voltage between electrodes of the transistor showed that the transistor had satisfactory insulating properties and operating characteristics.

Comparative Example 1

For comparison with the transistor of Example 1, a transistor was prepared in such a manner that heavily boron-doped diamond layers acting as a source or drain region were formed not by an epitaxial growth process but by the etching process described in Example 2 of Japanese Unexamined Patent Application Publication No. 2002-57167 described above so as to have end faces perpendicular to a substrate. In this comparative example, factors other than the thickness and shape of those layers were the same as those of the transistor of Example 1. In comparison between the transistor of this comparative example and the transistor of Example 1, the transistor of Example 1 had an about four times larger dielectric strength, an about 20 times larger transconductance, an about 80 times larger output, and an about 20 times larger cutoff frequency than those of the transistor of this comparative example.

Example 2

Figure 7:
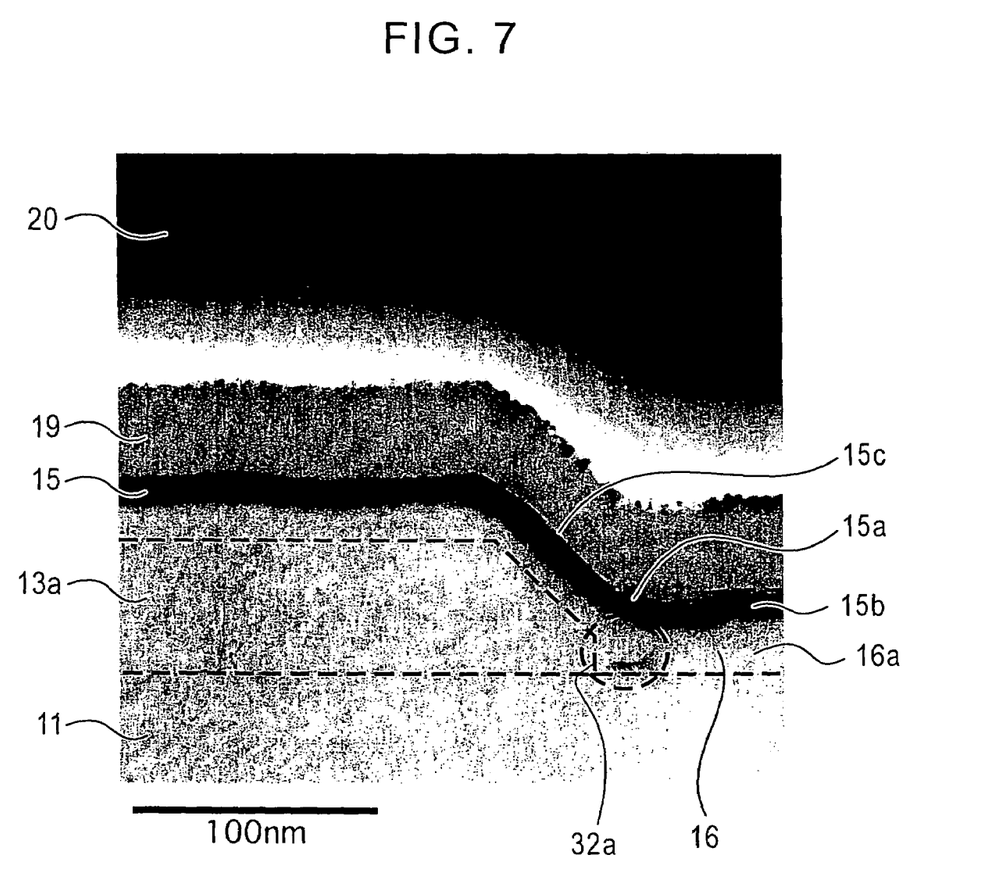
FIG. 7 is a TEM photograph partly showing a transistor of Example 2 in cross section at 350,000× magnification.

A pip-FET (hereinafter referred to as "transistor") of this example is described below. FIG. 7 is a TEM photograph partly showing the transistor in cross section. The transistor was prepared by substantially the same procedure as that described in Example 1 using a diamond substrate 11 having a {100} surface so as to include heavily boron-doped diamond layers, both having a thickness of 55 nm, each having corresponding end portions facing each other. The longitudinal direction of the end portions was parallel to the <100> direction. In the transistor shown in FIG. 7, the facing end portions had perpendicular faces 32a, extending perpendicularly from the diamond substrate 11, having a height of 20 nm. The perpendicular faces 32a were eliminated by forming an undoped diamond layer 15 over the end portions. The undoped diamond layer 15 in contact with the perpendicular faces 32a had hollows 16a having a depth of 5 nm. This is because the diamond layers were grown relatively slowly around the perpendicular faces 32a and the hollows 16a remained therein. The undoped diamond layer 15 had a slope 15a, inclined at an angle of about 45 degrees, having a {100} surface and a gentle slope 15c, inclined at an angle of about 33 degrees, located between the slope 15a and the bottom surface of the undoped diamond layer 15. The application of a voltage between electrodes of the transistor showed that the transistor had satisfactory insulating properties and operating characteristics.

Comparative Example 2

For comparison with the transistor of Example 2, a transistor was prepared in such a manner that heavily boron-doped diamond layers each acting as a source or drain region were formed not by an epitaxial growth process but by the etching process described in Example 2 of Japanese Unexamined Patent Application Publication No. 2002-57167 described above so as to have end portions having no slopes. In this comparative example, factors other than the thickness and shape of those layers were the same as those of the transistor of Example 2 described above. In comparison between the transistor of this comparative example and the transistor of Example 2, the transistor of Example 2 had an about three times larger dielectric strength, an about ten times larger transconductance, an about 40 times larger output, and an about ten times larger cutoff frequency than those of the transistor of this comparative example.

Example 3

Figure 8:
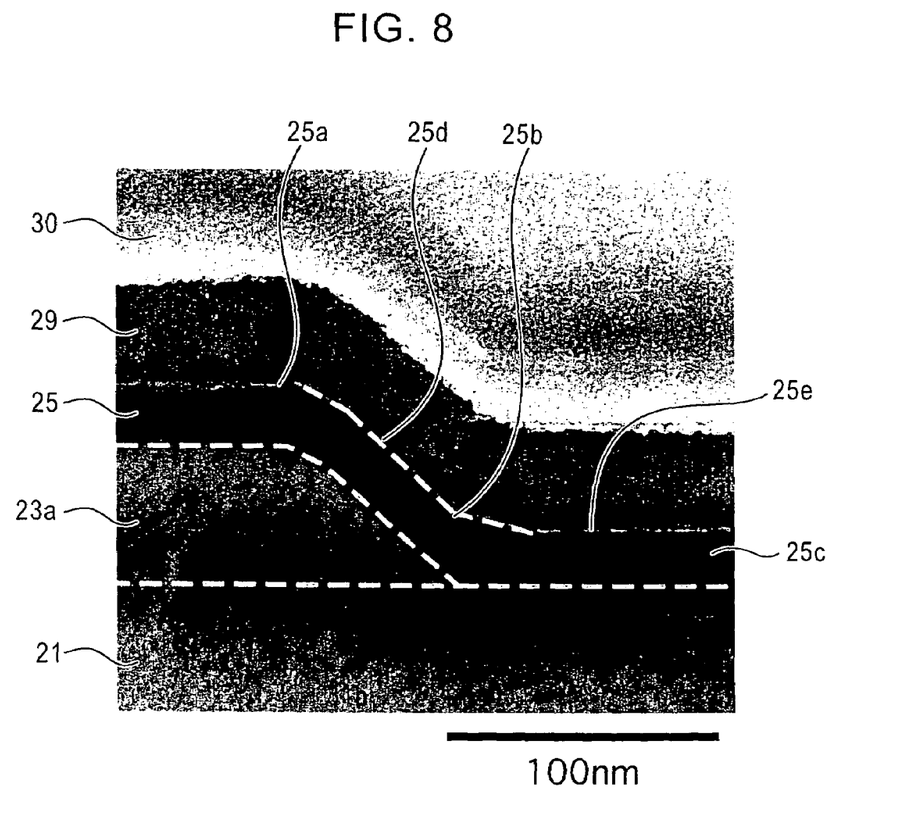
FIG. 8 is a TEM photograph partly showing a transistor of Example 3 in cross section at 350,000× magnification.

A pip-FET (hereinafter referred to as "transistor") of this example is described below. FIG. 8 is a TEM photograph partly showing the transistor in cross section. The transistor was prepared by substantially the same procedure as that described in Example 1 or 2 using a substrate having a {100} surface so as to include heavily boron-doped diamond layers having end portions facing each other. The longitudinal direction of the end portions was parallel to the <100> direction. The transistor included an undoped diamond layer 25, which had an upper section 25a; a slope 25b having an inclination angle of about 45 degrees; a first gentle slope 25d, located between the upper section 25a and the slope 25b, having an inclination angle of about 29 degrees; a bottom surface 25c; and a second gentle slope 25e, located between the bottom surface 25c and the slope 25b, having an inclination angle of about 16 degrees. The slope 25b had a {100} surface. The undoped diamond layer 25 had no defects. The application of a voltage between electrodes of the transistor showed that the transistor had satisfactory insulating properties and operating characteristics.

Comparative Example 3

For comparison with the transistor of Example 3, a transistor was prepared in such a manner that heavily boron-doped diamond layers each acting as a source or drain region were formed not by an epitaxial growth process but by the etching process described in Example 2 of Japanese Unexamined Patent Application Publication No. 2002-57167 described above so as to have end portions having no slopes. In this comparative example, factors other than the thickness and shape of the layers were the same as those of the transistor of Example 3. In comparison between the transistor of this comparative example and the transistor of Example 3, the transistor of Example 1 had an about four times larger dielectric strength, an about 40 times larger transconductance, an about 160 times larger output, and an about 40 times larger cutoff frequency than those of the transistor of this comparative example.

What is claimed is:

1. A diamond semiconductor device comprising:
   a substrate substantially made of single crystal diamond;
   a first diamond layer, locally placed on the substrate, containing an impurity;
   a second diamond layer containing the impurity, the second diamond layer being locally placed on the substrate and spaced from the first diamond layer; and
   a third diamond layer which has an impurity content less than that of the first and second diamond layers, which acts as a channel region located between the first and second diamond layers, and through which charges are transferred from the first diamond layer to the second diamond layer,
   wherein the first diamond layer has a first end portion, the second diamond layer has a second end portion facing the first end portion with a space located therebetween, the first and second end portions each have corresponding slopes epitaxially formed depending on the orientation of the substrate, and the third diamond layer lies over the slopes of the first and second end portions and a section of the substrate that is located under the space.

2. The diamond semiconductor device according to claim 1, wherein the third diamond layer has a uniform thickness.

3. The diamond semiconductor device according to claim 2, wherein the slopes of the first to third diamond layers have an average roughness of 1 nm or less and the third diamond layer has a section, located on the substrate, having an average roughness of 5 nm or less.

4. The diamond semiconductor device according to claim 1, wherein the third diamond layer have sections which each lie on the slope of the first or second diamond layer and of which the crystal planes are the same as those of the slopes thereof.

5. The diamond semiconductor device according to claim 1, wherein the slopes of the first and second diamond layers are inclined at an angle of 32 to 58 degrees to the substrate surface.

6. The diamond semiconductor device according to claim 1, wherein the first and second diamond layers have faces parallel to the substrate surface and the faces and slopes of the first and second diamond layers have curved or flat face portions, located therebetween, having an inclination angle less than that of the slopes.

7. The diamond semiconductor device according to claim 1, wherein at least one of the slopes of the first and second diamond layers has a {111} surface, a {100} surface, an intermediate surface between the substrate surface and {111}, or an intermediate surface between the substrate surface and {100}.

8. The diamond semiconductor device according to claim 7, wherein the substrate has a {110} surface, the boundaries between the substrate surface and the first and second diamond layers extend in the <110> direction, and the slopes of the first and second diamond layers each have a {111} surface.

9. The diamond semiconductor device according to claim 7, wherein the substrate has a {110} surface, the boundaries between the substrate surface and the first and second diamond layers extend in the <100> direction, and the slopes of the first and second diamond layers each have a {100} surface.

10. The diamond semiconductor device according to claim 7, wherein the substrate has a {100} surface, the boundaries between the substrate surface and the first and second diamond layers extend in the <110< direction, and the slopes of the first and second diamond layers each have a {111} surface.

* * * * *